ION-ETCHING METHOD

Filed Sept. 18, 1972

United States Patent Office 3,782,940

Patented Jan. 1, 1974

3,782,940

ION-ETCHING METHOD

Michihiro Ohto, Tokyo, Atsumi Noshiro, Yokohama, and Tetsuya Mayuzumi, Annaka, Japan, assignors to Dai Nippon Printing Co., Ltd., and Shinetsu Chemical Company, both of Tokyo, Japan Filed Sept. 18, 1972, Ser. No. 289,957
Claims priority, application Japan, Sept. 20, 1971, 46/73,148
Int. Cl. G03c *5/00*
U.S. Cl. 96—36 4 Claims

ABSTRACT OF THE DISCLOSURE

A photopolymerizable composition comprising 100 parts by weight of photopolymerizable organopolysiloxane made from γ-acryloxypropyltrichlorsilane and dihydroxydimethylpolysiloxane, 4 parts by weight of 4,4′-bis-(dimethylamino)-benzophenon, and 1,000 parts by weight of a solvent is applied over a base plate, and thereon a positive pattern is laid. From above the positive pattern a light is supplied to carry out developing and fixing treatments and subsequently ion-etching to finally obtain etched products having fine patterns with little side-etching phenomenon.

SUMMARY OF THE INVENTION

The present invention relates to improvements in or relating to an ion-etching method.

In etching for the formation of fine patterns on metallic or non-metallic plates, there are known, besides a mechanical process, a chemical process in which aqueous acid and alkali solutions are used, an electrolytic process in which electrolysis is utilized, and a process in which a high temperature gas is used.

The chemical and electrolytic etching processes which are conducted in a liquid have such demerits that surfaces to be etched are contacted and contaminated with the etching solution, and that the so-called side etching often takes place, making it very difficult to produce good fine patterns.

The gas-etching process also has such demerits that etching materials are limited in kind and that conventional photosensitive resins or other organic substances effective to form resists on the etching material can hardly be utilized in the process, since the etching materials must be kept at high temperatures while being subjected to the etching.

Recently, there has been proposed a process in which ion impacts of an energy higher than several tens of electron volts are applied to an etching plates, having resists in areas not to be etched, so that atoms thereon may be removed by means of the sputtering. According to this sputter etching process, the demerits of the conventional processes as described above may be solved. However, it is noted that the process has also serious defect that suitable resist-forming materials which are capable of readily producing desired letters and pictures and yet hardly removable by sputtering with the irradiation by ions having a high energy have not been found.

It is an object of the present invention to provide an ion-etching method, free from such demerits of the conventional processes as described above.

The method of the invention comprises that a photopolymerizable, hardened resist film of a composition comprising at least one photopolymerizable silicone, a sensitizer and a solvent is provided at non-etching areas on the plate surface and then the plate is subjected to ion-etching. According to the method, the photopolymerized, hardened resist film may not be removed by sputtering, and excellent ion-etched products may be readily obtained.

The method of the invention will be illustrated with reference to the accompanying drawings.

Figure 1:
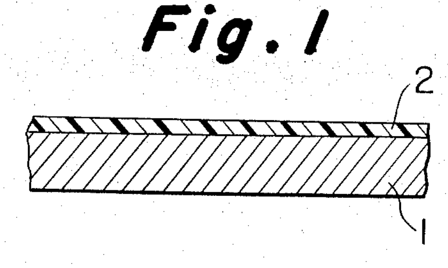

Referring to FIG. 1, a photopolymerizable composition comprising at least one photopolymerizable silicone, a sensitizer and a solvent is applied over the surface of a base plate 1 to be ion-etched, then dried by an infrared lamp or hot air, and thereafter cooled to form a film layer 2.

Figure 2:
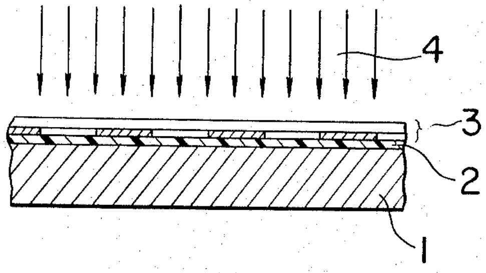
Figure 3:
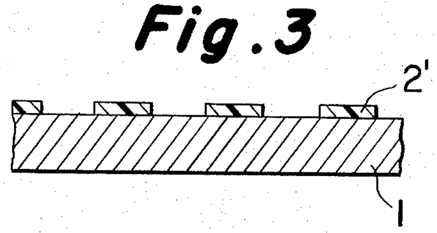

Then, as is shown in FIG. 2, a positive pattern 3 having desired letters, symbols, figures or designs is placed on the film layer 2. The positive pattern 3 and the layer 2 are closely contacted together under a reduced pressure. The positive pattern 3 is exposed to a light 4, for example, ultraviolet rays or strong visible rays. Thereafter, it is subjected to development with a developing solution, washed with water and subjected to a fixing treatment, such as "burning," to obtain a tough, insoluble film having excellent heat-, chemical-, and corrosion-resistance and having a low sputter etch removal rate. Non-exposed areas on the layer 2 are washed away by the development, resulting in forming photopolymerized, hardened patterned resists 2′ of the layer 2 at the areas not to be subjected to the ion-etching treatment on the base plate 1, as shown in FIG. 3.

Figure 4:
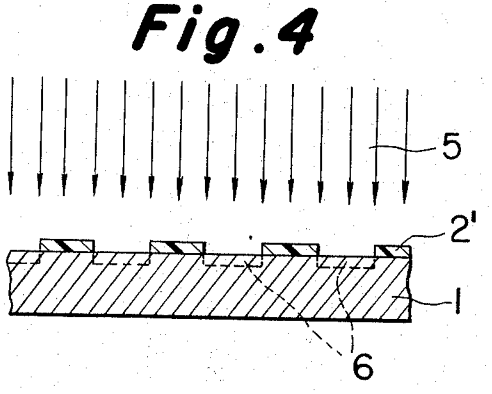

Further, referring to FIG. 4, the surface of the plate 1 on which the photopolymerizable, hardened patterned resists 2′ have been formed is struck with ions 5 of an energy higher than several tens of electron volts, according to a known ion-etching process. By this treatment, the plate surfaces except the areas covered with resists 2′ are ion-etched. The etching is terminated when a predetermined size or depth as indicated with dotted lines 6 has been attained. The resists 2′ on the plate 1 are then removed by washing with an organic solvent, an acid or alkali solution in a usual manner. The plate 1 is then rinsed thoroughly and dried. Accordingly to this method, it is not required to keep the plate surfaces 1 at a high temperature during the etching treatment, and excellent etched products may be obtained without side-etching phenomenon or contamination with impurities.

The base plates 1 for use in the present invention may be any ones having been used in conventional ion-etching processes, exemplified by metallic plates, such as copper plates, iron plates, aluminum plates, nickel plates, stainless steel plates, silicon wafers, alloy plates, such as 80% Cr-20% SiO plates, copper or iron plates plated with nickel, non-metallic plates, such as glass plates and synthetic resin plates, with or without being coated with a thin metal film by plating, vacuum evaporation or usual painting method. These plates are preferred to have a uniform thickness and smooth surfaces so as to be coated uniformly with the photopolymerizable composition. Further, the surfaces should be pretreated for cleansing, since any oils, fats, oxides or dusts attached to the surfaces tend to render the coating uneven and cause pinholes and peeling off. It is preferred, further, to make the surfaces rough to a proper extent so as to ensure close contact thereof with the layer 2.

The photopolymerizable composition employed in practicing the method of the invention is prepared merely by mixing at least one photopolymerizable silicone, a sensitizer, a solvent and in addition, if necessary, such additives as thermal polymerization inhibitors and fillers. The viscosity of the composition may be adjusted to be suitable for application.

The photopolymerizable silicones mentioned above are exemplified by organopolysiloxanes containing at least one photopolymerizable organic silicon radical represented by the general formula $$\mathrm{HC(R^1){=}C(R^2){-}C({=}O){-}O{-}R^3{-}Si(R^4_a)X_bO_{\frac{3-a-b}{2}}} \qquad \text{(I)}$$

where $R^1$ is a hydrogen atom or an unsubstituted or halogen-substituted phenyl radical; $R^2$ is a hydrogen atom or a methyl radical; $R^3$ is an unsubstituted or halogen-substituted divalent hydrocarbon radical, having from 1 to 10 carbon atoms; $R^4$ is an unsubstituted or a halogen-substituted monovalent hydrocarbon radical, having from 1 to 10 carbon atoms; X is a hydroxyl radical or an alkoxy radical, having from 1 to 4 carbon atoms; $a$ and $b$ each are 0, 1 or 2, with the proviso that $(a+b)=0$, 1 or 2, or by the general formula $$\overset{R^1}{\overset{|}{HC}}=\overset{R^2}{\overset{|}{C}}-\underset{\underset{O}{\|}}{C}-O-(R^3-O)_l-\overset{R^4_m}{\overset{|}{Si}}X_nO_{\frac{3-m-n}{2}} \qquad \text{(II)}$$

where $R^1$, $R^2$, $R^3$, $R^4$ and X are as defined above, $l$ is 0 or 1, and $m$ and $n$ are 0, 1 or 2, with the proviso that $(m+n)=0$, 1 or 2.

The polymerizability of the organopolysiloxanes is due to the presence of organic radicals represented by the general formula $$\overset{R^1}{\overset{|}{HC}}=\overset{R^2}{\overset{|}{C}}-\underset{\underset{O}{\|}}{C}-O- \qquad \text{(III)}$$

where $R^1$ and $R^2$ are as defined above. These organic radicals are exemplified by acryloxy, methyacryloxy, cinnamoyloxy, and halogenocinnamoyloxy radicals.

The unsubstituted or halogen-substituted divalent hydrocarbon radicals, represented by $R^3$ in the General Formulas I and II, are exemplified by alkylene radicals, such as methylene, propylene, butylene, and 2,2-dimethyl - 1,3 - propyl radicals; arylene radicals, such as phenylene radicals; alkarylene radicals, such as phenylethylene radicals; and their halogen substituted analogues.

The unsubstituted or halogen-substituted hydrocarbon radicals, represented by $R^4$ in the General Formulas I or II are exemplified by alkenyl radicals, such as vinyl and allyl radicals; cycloalkenyl radicals, such as cyclohexenyl radicals; alkyl radicals, such as methyl, ethyl, propyl, and octyl radicals; aryl radicals, such as phenyl radicals; aralkyl radicals, such as benzyl and phenylmethyl radicals; alkaryl radicals, such as styryl and tolyl radicals; and their halogen substituted analogues, such as chloromethyl, trichloroethyl, perfluorovinyl, trifluoropropyl, and perchlorotolyl radicals.

The organopolysiloxane must be an organic silicon compound. The or each photopolymerizable organic silicon radical present in the organopolysiloxane is bonded by a siloxane-bond (≡Si—O—Si≡) to an organic silicon compound containing at least one unit represented by the general formula $$R^5_cSiX_dO_{\frac{4-c-d}{2}} \qquad \text{(IV)}$$

where $R^5$ is, like $R^4$ above, an unsubstituted or halogen substituted monovalent hydrocarbon radical, having from 1 to 10 carbon atoms; X is as defined above; $c$ and $d$ are 0, 1, 2 or 3, with the proviso that $(c+d)=0$, 1, 2, or 3, or an organic silicon compound containing a unit represented by the general formula $$R^5_jSiX_kO_{\frac{4-j-k}{2}} \qquad \text{(V)}$$

where $R^5$ and X are as defined above, $j$ and $k$ are 0, 1, 2 or 3, with the proviso that $(j+k)=0$, 1, 2 or 3. The organic silicon compounds consisting of the unit of the General Formulas IV or V may be oily, rubbery or resinous in appearance, and straight-chained, side-chained, or cyclic in structure.

The organopolysiloxane having at least one photopolymerizable organic silicon radical of the General Formula I can be prepared by known method, examples of which are the following two methods.

One of the methods is to react photopolymerizable organic silicon monomers represented by the general formula $$\overset{R^1}{\overset{|}{HC}}=\overset{R^2}{\overset{|}{C}}-\underset{\underset{O}{\|}}{C}-O-R^3-\overset{R^3_a}{\overset{|}{Si}}Z_{3-a} \qquad \text{(VI)}$$

where $R^1$, $R^2$, $R^3$, $R^4$ and $a$ are as defined above, and Z is a halogen atom, an acetoxy radical, a hydroxyl radical or an alkoxy radical having from 1 to 4 carbon atoms, with silanes or siloxanes represented by the general formula $$R^5_c-Si-Y_eO_{\frac{4-c-e}{2}} \qquad \text{(VII)}$$

where $R^5$ and $c$ are as defined above, Y is a halogen atom, acetoxy radical, a hydroxyl radical or an alkoxy radical having from 1 to 4 carbon atoms, and $e$ is 1, 2, 3 or 4. This method shall be hereinafter be referred to as the Monomer Method.

The other method is to first react silanes or siloxanes represented by the general formula $$(Q-R^3)_f-\overset{H_g}{\overset{|}{\underset{\underset{R^4_a}{|}}{Si}}}-Y_eO_{\overline{3-a-e}} \qquad \text{(VIII)}$$

where $R^3$, $R^4$, Y, $a$ and $e$ are as defined above; Q is a halogen atom; $f$ and $g$ are 0 or 1, with the provisio that $(f+g)=1$, with the silanes or siloxanes of the General Formula VII, to obtain organopolysiloxanes having at least one radical represented by:

$$(Q-R^3)_f-\overset{H_g}{\overset{|}{\underset{\underset{R^4_a}{|}}{Si}}}-X_bO_{\frac{3-a-b}{3}} \qquad \text{(IX)}$$

where Q, $R^3$, $R^4$, X, $a$, $b$, $f$ and $g$ are as defined above, and then react the organopolysiloxanes thus obtained with the organic compounds having the photopolymerizable organic radical of the General Formula III. This method shall hereinafter be referred to as the Polymer Method.

The photopolymerizable organic silicon monomers of the General Formula VI, employed in the Monomer Method may be synthesized by various known methods, for example, by subjecting them to addition reaction between compounds containing photopolymerizable organic radicals of the General Formula III and an aliphatic unsaturated bond and silanes represented by the general formula $$H\overset{R^4_a}{\overset{|}{Si}}Z_{3-a} \qquad \text{(X)}$$

where $R^4$, Z and $a$ are as defined above, in the presence of a catalyst, such as chloroplatinic acid, or by subjecting them to dehalogenated-salt reaction between alkali metal salts or tertiary amine salts of carboxylic acid containing photopolymerizable organic radicals of the General Formula III and organoalkoxysilanes represented by the general formula $$Q-R^3-\overset{R^4_a}{\overset{|}{Si}}(OR^6)_{3-a} \qquad \text{(XI)}$$

where Q, $R^3$, $R^4$ and $a$ are as defined above, and $R^6$ is a monovalent hydrocarbon radical, having from 1 to 4 carbon atoms. In this case, the compounds having in their General Formula III and aliphatic unsaturated bonds are exemplified by allyl esters, such as acrylic acids, methacrylic acids, cinnamic acids and halogen-substituted cinnamic acids; ethylene glycol diacrylate, ethylene glycol dimethacrylate, ethylene glycol dicinnamate, propylene glycol-diacrylate or propylene glycol dimethacrylate, neopentyl glycol dimethacrylate, trimethylethane trimethacrylate, trimethylpropane trimethacrylate and trimethylethane tricinnamate.

The silanes of the General Formula X are exemplified by chlorosilanes such as trichlorosilanes, methyldichlorosilanes, ethyldichlorosilanes, propyldichlorosilanes, isopropyldichlorosilanes, butyldichlorosilanes, hexyldichlorosilanes, octyldichlorosilanes, 2-ethylhexyldichlorosilanes, phenyldichlorosilanes, tolyldichlorosilanes, cyclohexyldichlorosilanes, chloromethyldichlorosilanes, γ-bromopropyldichlorosilanes, γ-trifluoropropyldichlorosilanes, chlorophenyldichlorosilanes, trifluoromethylphenyldichlorosilanes, dimethylmonochlorosilanes, methylethylmonochlorosilanes, methylphenylmonochlorosilanes, ethyltolylmonochlorosilanes, methyltrifluoropropylmonochlorosilanes, ethylcyclohexylmonochlorosilanes and diphenylmonochlorosilanes; and various silanes in which a part or the whole of the chlorine atoms directly bonded to the silicon atoms in the chlorosilanes are replaced by other halogen atoms, acetoxy radicals, hydroxyl radicals or alkoxy radicals having from 1 to 4 carbon atoms, those silanes being exemplified by trimethoxysilane, chlorodiethoxysilanes, methyldibutoxylsilanes, isopropyldiacetoxysilanes, phenylmethylsilanol, ethyldibromosilanes, ethoxydiacetoxysilanes, dimethyliodidosilanes, phenylisopropoxybromosilane, phenyldisilanol, cyclohexyldiacetoxysilanes, tertiary butyldibromosilanes, tolydifluorosilanes and tolylfluoropropyldiethoxysilanes.

Further, the alkali metal salts or tertiary amine salts of carboxylic acid having photopolymerizable organic radicals of the General Formula III are exemplified by sodium salts, potassium salts, pyridium salts, dimethylaniline salts and triethylamine salts of acrylic acid, methacrylic acid, cinnamic acid or halogen-substituted cinnamic acid. The organoalkoxysilanes of the General Formula XI are exemplified by chloromethyl trimethoxysilane, bromomethyltrimethoxysilane, chloromethylethyldimethoxysilane, iodomethylmethyldiethoxysilane, chloromethyltriisopropoxysilane, β-bromoethyltriethoxysilane, β-chloroethylmethyldimethoxysilane, γ-chloropropyltrimethoxysilane, γ-chloropropyltriethoxysilane, γ-bromopropylmethyldibutoxysilane, γ-iodopropyldiisopropoxysilane, γ-bromoisobutyldiphenylethoxysilane, δ-chlorobutylphenyldimethoxysilane, δ-iodobutyltrimethoxysilane β-bromoethylphenyltriethoxysilane, chloromethylallyldimethoxysilane, chloromethylvinyldimethoxysilane, γ-chloropropylvinyldiethoxysilane, γ-bromopropylvinylphenylethoxysilane, or δ-iodobutylallyldiisopropoxysilane.

The photopolymerizable organic silicon monomers of the General Formula VI prepared by the Monomer Method from the materials given above are examplified by acryloxymethyltrichlorosilane,
γ-methacryloxypropyltrichlorosilane,
δ-methacryloxybutyl-triethoxysilane,
or
-trichlorosilane,
γ-acryloxypropylmethyldichlorosilane,
γ-acryloxypropyl-metyldimetyloxysilane
or
-phenyldichlorosilane,
methacryloxymethyl trihydroxysilane,
γ-methacryloxypropylmonomethoxy-dichlorosilane,
cinnamoyloxymethyltrichlorosilane,
halogenocinnamoyloxymethyltrimethoxysilane,
γ-cinnamoyloxypropyl-trimethoxysilane
or
-trichlorosilane,
δ-halogenocinnamoyl-oxybutyl-trihydroxysilane,
or
-trichlorosilane,
γ-methacryloxypropyltetramethoxydisiloxane,
mono-addition compounds of trichlorosilane to
ethyleneglycol-diacrylate or -methacrylate, mono-addition compounds of methyldichlorosilane to triethyleneglycoldimethacrylate, mono-addition compounds of trichlorosilane to neo-pentylglycoldimethacrylate, mono-addition compounds of trichlorosilane to 1,3-butyleneglycoldimethacrylate, various silanes in which a part or the whole of the chlorine atoms directly bonded to silicon atoms in the chlorosilanes are replaced with other halogen atoms, acetoxy radicals, hydroxyl radicals or alkoxy radicals, having from 1 to 5 carbon atoms, and partial condensates of those silanes.

The silanes or siloxanes of the General Formula VII, used in the Monomer Method, are exemplified by chlorosilanes, such as tetrachlorosilanes,
methyltrichlorosilanes,
ethyltrichlorosilanes,
propyltrichlorosilanes,
2-ethylhexyltrichlorosilanes,
vinyltrichlorosilanes,
allyltrichlorosilanes,
cyclohexyltrichlorosilanes,
phenyltrichlorosilane,
benzyltrichlorosilanes,
styryltrichlorosilanes,
tolyltrichlorosilanes,
chloromethyltrichlorosilanes,
γ-trifluoropropyltrichlorosilanes,
parachlorotolyltrichlorosilanes,
dimethyldichlorosilanes,
methylethyldichlorosilanes,
methylbutyldichlorosilanes,
methylcyclohexyldichlorosilanes,
methylphenyldichlorosilanes,
methylvinyldichlorosilanes,
methylallyldichlorosilanes,
methyltolyldichlorosilanes,
γ-trifluoropropylmethyldichlorosilanes,
chloromethylphenyldichlorosilanes,
γ-chloropropylphenyldichlorosillanes,
diphenyldichlorosilanes,
phenylvinyldichlorosilanes,
phenylcyclohexyldichlorosilanes,
trimethylchlorosilanes,
methyldiphenylchlorosilanes,
diethylphenylchlorosilanes,
triphenylchlorosilanes,
dimethylphenylchlorosilanes,
dimethylchloromethylchorosillanes
γ-trifluoropropyldimethylchlorosilanes,
dicyclohexylchlorophenylchlorosilanes,
ethylisobutyltolylchlorosilane,
and
vinylethylphenylchlorosilanes, various silanes in which a part or the whole of the chlorine atoms directly bonded to silicon atoms in the chlorosilanes are replaced by other halogen atoms, acetoxy radicals, hydroxyl radicals, alkoxy radicals having from 1 to 4 carbon atoms, or metaloxy salts of alkali metal, and siloxanes obtained by subjecting those silanes to cohydrolysis, dehydration, dehydrohalogenation, deacetylation, dealcoholization, dealkyl acetylation or dealkyl halogenation. The siloxanes of the General Formula VII may be oil, rubbery, or resinous in appearance, and straight-chained, side-chained or cyclic in structure, provided that they contain at least one chlorine atom, acetoxy radical, hydroxyl radical, or alkoxy radical having from 1 to 4 carbon atoms, directly bonding to a silicon atom in their molecule. Furthermore, these siloxanes may be of either low molecular weight with only several silicon atoms or high molecular weight with hundreds or thousands of silicon atoms, provided that they contain at least one chlorine atom, hydroxyl radical, alkoxy radical having from 1 to 4 carbon atoms, or alkali metaloxy radical, bonding to a silicon atom in their molecule.

There are many ways in which the photopolymerizable organic silicon monomer of Formula VI is reacted with the silanes or siloxanes of Formula VII to produce the organopolysiloxane having at least one photopolymerizable organic silicon radical of Formula I. In one example, a mixture of the photopolymerizable organic silicon monomer of Formula VI and the silane or siloxane of Formula VII may be cohydrolyzed and then subjected to condensation reaction. In another example, in the case where the photopolymerizable organic silicon monomer of Formula VI and the silane or siloxane of Formula VII contain silanol radicals, they may be mixed and subjected to dehydration, in which in order to accelerate the dehydration, it is preferable to use a known catalyst, such as, sulfonic acid, phosphoric acid, hydrochloric acid, trichloroacetic acid, isopropyl orthotitanate, dibutyltin dilaulate, or sodium ethylate. In the case where one of the photopolymerizable organic silicon monomer of Formula VI and the silane or siloxane of Formula VII contains a halogen atom or an acetoxy radical bonding to a silicon atom, while the other contains a silanol radical bonding to a silicon atom, they may be mixed and subjected to dehydrohalogenation or deacetation, during which the hydrogen halide or acetic acid generated should be either removed from the reaction system or inactivated by use of a trapping agent, such as pyridine or triethylamine.

In still another example, in the case where one of the photopolymerizable organic silicon monomer of Formula VI and the silane or siloxane of Formula VII contains an alkoxy radical bonding to a silicon atom, while the other contains silanol radical bonding to a silicon atom, they may be mixed and subjected to dealcoholization, during which the alcohol generated should be removed from the reaction system. In order to accelerate the reaction, it is preferred to use a known catalyst, such as, sulfuric acid, phosphoric acid, paratoluenesulfonic acid, isopropyl titanate, sodium ethylate or potassium ethylate.

In the still further case where one of the photopolymerizable organic silicon monomer of Formula VI and the silane or siloxane of Formula VII contains an alkoxy radical bonding to a silicon atom, while the other contains a halogen atom or an acetoxy radical bonding to a silicon atom, they may be mixed and subjected to dehalogenated-alkylation or dealkyl-acetylation, during which the alkyl halide or alkyl acetate generated is removed from the reaction system. In order to accelerate the reaction, a catalyst, such as zinc chloride or ferric chloride may be used.

Further, in the case where one of the photopolymerizable organic silicon monomer of Formula VI and the silane or siloxane of Formula VII contains an halogen atom or an acetoxy radical bonding to a silicon atom, while the other contains an alkali metaloxy radical bonding to a silicon atom, they may be mixed and subjected to dehalogenated-alkali-metal-salt reaction or dealkali-metal-acetate reaction, which reaction being able to proceed violently only by the mixing to obtain the desired organopolysiloxanes.

In each of the reactions described above, it is preferred to use a suitable amount of an inert organic solvent to enable the reaction to be carried out easily. Examples of solvents that may be used are methyl ethyl ketone, methyl isobutyl ketone, benzene, toluene, xylene, tetra chloromethan, trichloroethane or tetrachloroethane. In order to accelerate these reactions, it is sometimes desirable to raise the temperature of the reaction system. In such a case, it is preferable to add a thermal polymerization inhibitor in order to protect the organic radical of Formula III which is a photopolymerizable part in the photopolymerizable organic silicon monomer of Formula VI. The thermal polymerization inhibitor is selected from the group consisting of quinone derivatives, such as hydroquinone and benzoquinones, amine salts, and hydrazine salts.

Now, the embodiments of the Polymer Method will be explained in the following. Generally speaking the various reactions in the Monomer Method as described above may be applicable to the Polymer Method.

In the synthesis of organopolysiloxanes containing at least one radical of Formula IX by the Polymer Method, in which the silane or siloxane of Formula VII is reacted with the silane or siloxane of Formula VIII where $g$ is 0 and $f$ is 1, the various reactions of the Monomer Method, for example, cohydrolysis-copolycondensation reaction, dehydration reaction, dehalogenation reaction, deacetation reaction, dealcoholization reaction, dealkylacetylation reaction and dealkylhalogenation reaction may be applied, these reactions being selected depending upon the kind of reactive radical Y contained in the silanes or siloxanes of Formulas VIII and VII. The reaction conditions and catalysts used may be the same as in the Monomer Method. The resulting organopolysiloxanes contain at least one radical represented by the general formula $$Q{-}R^3{-}\overset{\displaystyle R_a^4}{\overset{|}{Si}}X_bO_{\frac{3-a-b}{2}} \qquad (IX')$$

where Q, $R^3$, $R^4$, X, $a$ and $b$ are as defined above, corresponding to the radical of Formula IX where $g$ is 0 and $f$ is 1.

Further, in the case where the values of $g$ and $f$ in the Formula VIII are 1 and 0, respectively, the reactions may be any one of cohydrolysis condensation reaction, dehydration reaction and dealcoholization reaction as employed in the Monomer Method, depending upon the kind of radical Y contained in the silanes or siloxanes of Formulas VIII and VIII. The resulting organopolysiloxanes contain at least one radical represented by the general formula $$H{-}\overset{\displaystyle R_a^4}{\overset{|}{Si}}X_bO_{\frac{3-a-b}{2}} \qquad (IX'')$$

where R, X, $a$ and $b$ are as defined above, corresponding to the radical of Formula IX where $g$ is 1 and $f$ is 0.

The silanes or siloxanes of Formula VIII, where $f$ is 0 and $g$ is 1 are exemplified by chlorosilanes, such as, trichlorosilanes, methyldichlorosilanes, ethyldichlorosilanes, propyldichlorosilanes, isopropyldichlorosilanes, butyldichlorosilanes, hexyldichlorosilanes, octyldichlorosilanes, 2-ethylhexyldichlorosilanes, phenyldichlorosilanes, tolyldichlorosilanes, cyclohexyldichlorosilanes, chloromethyldichlorosilanes, γ-bromopropyldichlorosilanes, γ-trifluoropropyldichlorosilanes, chlorophenyldichlorosilanes, trifluoromethyl phenyldichlorosilanes, dimethylmonochlorosilanes, methylethylmonochlorosilanes, methylphenylmonochlorosilane, ethyltolylmonochlorosilanes, methyltrifluoropropylmonochlorosilanes, ethylcyclohexylmonochlorosilanes and diphenylmonochlorosilane, various silanes in which part or all of the chlorine atoms bonding to silicon atoms in the chlorosilanes are substituted by other halogen atoms, acetoxy radicals, hydroxy radicals or alkoxy radicals having from 1 to 4 carbon atoms, and siloxanes obtained by subjecting the substituted silanes to such reaction as cohydrolsis-copolycondensation, dehydration, dehydrohalogenation, deacetation, dealcoholization, dealkylacetylation reaction, or dealkylhalogenation.

The silanes or siloxanes of Formula VIII where $f$ is 1 and $g$ is 0 are exemplified by chlorosilanes, such as chloromethyltrichlorosilanes, bromomethyltrichlorosilanes, iodomethyltrichlorosilanes, β-bromoethyltrichlorosilanes, β-chloroethyltrichlorosilanes, γ-chloropropyltrichlorosilanes, γ-bromopropyltrichlorosilanes, γ-iodopropyltrichlorosilanes, γ-bromoisobutyltrichlorosilanes, δ-chlorobutyltrichlorosilanes, β-bromoethylphenyltrichlorosilanes, chloromethyldichlorosilanes, bromoethyltolyldichlorosilanes, bromomethylallyldichlorosilanes, γ-chloropropyldimethylchlorosilanes, δ-iodobutylphenyldichlorosilane, and chlorophenyltrichlorosilane, various silanes in which part or all of the chlorine atoms bonding to silicon atoms in the chlorosilanes are substituted by other halogen atoms, acetoxy radicals, hydroxyl radicals or alkoxy radicals having 1–4 carbon atoms, and siloxanes obtained by subjecting the substituted silanes to such reaction as cohydrolysis-copolycondensation, dehydration, dehydrohalogenation, deacetation, dealcoholization, dealkylacetylation, or dealkylhalogenation.

The siloxanes of Formula VIII are not particularly limited, regardless of $f$ being either 0 or 1; they may be oily, rubbery or resinous in appearance, and straight-chained, side-chained, or cyclic in structure. Further, these siloxanes may be of either lower molecular weight with only several silicon atoms or high molecular weight hundreds or thousands of silicon atoms, provided that they contain at least one halogen atom, acetoxy radical, hydroxyl radical, or alkoxy radical having from 1 to 4 carbon atoms, bonding to a silicon atom in their molecules.

The silanes or siloxanes of Formula VII that are used in the Polymer Method may be the same as used in the Monomer Method.

In the Polymer Method, organopolysiloxanes containing at least one polymerizable organic silicon radical of Formula I is prepared by reacting the organopolysiloxanes containing at least one radical of Formula IX′ or the organopolysiloxanes containing at least one radical represented by the General Formula IX″ with organic compounds containing photopolymerizable organic radicals of Formula III. Examples of the organic compounds are compounds containing photopolymerizable organic radicals of Formula III at one end of their structure and aliphatic unsaturated bonds at the other end, as used in the preparation of the photopolymerizable organic silicon monomers of Formula VI, according to the Monomer Method, and alkali metal or teritiary amine salts of carbocylic acid, containing photopolymerizable organic radicals of Formula III.

Further, according to the Polymer Method, the preparation of organopolysiloxanes containing at least one photopolymerizable organopolysiloxane radical of Formula I may be carried out by dehalogenated-salt reaction of polyorganosiloxanes containing at least one radical of Formula IX′ with alkali metal or teritiary amine salts of carbocylic acid, containing photopolymerizable organic radicals of Formula III. Solvents that may preferably be used in the dehalogenated-salt reaction are dimethylformamide, toluene, xylene, methyl ethyl ketone, and dibutyl ethers. In order to accelerate the reaction, it is preferred to use a catalyst, such as a teritiary amine or quaternary ammonium salt at an elevated temperature.

Furthermore, organopolysiloxanes containing at least one photopolymerizable organic silicon radical of Formula I may be prepared according to the Polymer Method also by addition reaction of unsaturated organopolysiloxanes containing at least one radical of Formula IX″ with compounds containing in its structure photopolymerizable organic radicals of Formula III at one end of their structure and aliphatic unsaturated bonds at the other end in the presence of a catalyst, for example, a chloroplatinic acid.

Alkali metal or teritiary amine salts of carboxylic acid, containing photopolymerizable organic radicals of Formula III and compounds containing in their structure photopolymerizable organic radicals of Formula III and aliphatic unsaturated bonds that are used in the procedures described above may be the same as used in the Monomer Method.

The organopolysiloxanes having at least one polymerizable organic silicon radical of Formula II may be prepared by a known method, for example, by reacting unsaturated compounds represented by the general formula $$HC(R^1)=C(R^2)-C(=O)-O-\left(R^3-O\right)_l W \qquad \text{(XII)}$$

where $R^1$, $R^2$, $R^3$ and $l$ are as defined above and W is a hydrogen atom or an alkali metal, with organopolysiloxanes represented by the general formula $$V\overset{R^4_m}{\overset{|}{Si}}X_nO_{\frac{3-m-n}{2}} \qquad \text{(XIII)}$$

where $R^4$, X, $m$ and $n$ are as defined above and V is a hydrogen atom, a halogen atom, acetoxy radical or alkoxy radical having from 1 to 4 carbon atoms.

The unsaturated compounds represented by the General Formula XII are exemplified by acrylic acid, methacrylic acid, cinnamic acid, halogen-substituted cinnamic acid, and sodium, potassium and calcium salt thereof, hydroxymethyl acrylate, 2 - hydroxyethyl acrylate, 3-hydroxypropyl acrylate, 3-chloro-2-hydroxypropyl acrylate, p-hydroxyphenyl acrylate, hydroxymethyl methacrylate, 2-hydroxyethyl methacrylate, 3-hydroxypropyl methacrylate, 3-chloro-2-hydroxypropyl methacrylate, 3-hydroxyisobutyl methacrylate, p-hydroxyphenyl methacrylate, p-hydroxyethyl methacrylate, 2-hydroxyetyl cinnamate, 3-hydroxypropyl cinnamate, 4-hydroxybutyl cinnamate, and 3 - chloro-2-hydroxypropyl cinnamate, and alkali metal alkolates thereof, glycidyl methacrylate, glycidyl acrylate, glycidyl cinnamate, and glycidyl halogeno cinnamate.

The organopolysiloxanes represented by the General Formula XIII are exemplified by
methylmethoxypolysiloxane,
methylphenylethoxypolysiloxane,
methylhydrogenpolysiloxane,
methylvinylethoxypolysiloxane,
ethylhydrogenpolysiloxane,
methyloctylhydrogenpolysiloxane,
methylchlorophenylmethoxypolysiloxane,
tetramethyldimethoxydisiloxane,
tetramethyldihydrogendisiloxane,
octamethyldiphenyldiethoxysiloxane,
hexamethyldiacetoxytrisiloxane,
α,ω-dichloromethylpolysiloxane,
α,ω-dichloromethylphenylpolysiloxane,
α,ω-diacetoxymethylethylpolysiloxane,
α,ω-dibutoxymethylphenylsiloxane, and
methyltrifluoropropylhydrogen polysiloxane.

There are many ways in which the unsaturated compounds of Formula XII are reacted with the organopolysiloxanes of Formula XIII, to produce the organopolysiloxanes having at least one photopolymerizable organic silicon radical of Formula II. For example, in the case where W in the General Formula XII is a hydrogen atom and V in the General Formula XIII is also a hydrogen atom, the unsaturated compounds of Formula XII and the organopolysiloxanes of Formula XIII are mixed and then subjected to dehydration, in which in order to accelerate the dehydration, it is preferable to use a known catalyst, such as metallic zinc powder or tertiary amine. In the case where W in the General Formula XII is a hydrogen atom and V in the General Formula XIII is a halogen atom or acetoxy radical, the unsaturated compounds of Formula XII and the organopolysiloxane of Formula XIII may be mixed and subjected to dehydrohalogenation or deacetation, during which the hydrogen halide or acetic acid generated may be either removed from the reaction system any of the hydrogen halide or acetic acid left unremoved may be removed in the presence of a trapping agent.

In still another case where W in the General Formula XII is a hydrogen atom and V in the General Formula XIII is an alkoxy radical having from 1 to 4 carbons, the unsaturated compounds of Formula XII and the organopolysiloxanes of Formula XIII are mixed and then subjected to ester-change reaction, in which in order to accelerate the reaction, a known catalyst may be used. Examples of these catalysts are sodium ethylate, isopropyl orthotitanate, sulfuric acid, acetic trifluoride and triethyl amine.

In the case where W in the General Formula XII is an alkali metal and V in the General Formula XIII is a halogen atom or an acetoxy radical, the unsaturated compounds of Formula XII and the organopolysiloxanes of Formula XII are mixed and then subjected to dealkalimetal-salt reaction, to obtain the desired organopolysiloxane.

In the further case where W in the General Formula XII is an epoxy radical and V in the General Formula XIII is a halogen atom or an acetoxy radical, the unsaturated compounds and the organopolysiloxanes are mixed and subjected to ring cleavage of the epoxy radical, to produce organopolysiloxanes having at least one photopolymerizable organic silicon radical of Formula I.

In each of the reactions described above, it is preferred to use a suitable amount of an inert organic solvent. Examples of solvents that may be used are methyl ethyl ketones, methyl isobutyl ketones, aromatic hydrocarbons, such as benzene, toluene and xylene, and chlorinated solvents, such as trichloroethylene and tetrachloroethylene. In order to accelerate these reactions it is desirable to raise the temperature of the reaction system. In such a case, it is preferable to add a thermal polymerization inhibitor so that the unsaturated radicals of Formula III which is a polymerizable part in the unreacted compounds of Formula XII may be protected. The thermal polymerization inhibitor is selected from the group consisting of quinone derivatives, such as hydro quinones and benzoquinones, amine salts, hydrazine salts, aldehydes, and ascorbic acids.

A photosensitizer used in the present added to the above-invention may be any substance that absorbs rays and thus becomes excited and capable of giving energy to the organopolysiloxanes having the radical of Formula I or II, and accelerating the photopolymerization velocity, when it collides with the organopolysiloxane. Examples of photosensitizers that may be used are amino-, nitro- and phenol compounds, such as p-hydrodiphenyl, p-nitroaniline, picramide, 2,6-dichloro-4-nitroaniline, 2,4-dinitrophenol; keton compounds, such as benzaldehyde, acetophenone, p,p′-diamino-benzophenone, p,p′-tetramethyldiaminobenzophenone (Michler's ketone); quinone compounds, such benzoquinone, anthroquinone, 1,2-naphthoquinone; anthrone compounds; such as 3-methyl-1,3-diazo-1,9-benzanthrone; dyes, such as malachite green, methylene blue, chrome green, rhodamine blue, azo green TEG; and pyrilium salts, such as 2,4,6-triphenyl-pyrilium perchlorate, 2,4,6-triphenylthiapyrilium perchlorate, 2,4,6-triphenylpyrilium-fluoborate, and 2,4,6 - triphenyl-thiapyrilium fluoborate. The photosensitizer may preferably be used in an amount of from 0.05 to 5.0% by weight, based on the weight of the organosiloxane having at least one photopolymerizable organic silicon radical of Formula I or II.

The photopolymerizable compositions of the invention are dissolved in a solvent, so that their viscosity may be controlled when they are coated over a substratum or a base plate. The solvent may be selected from the group consisting of ketones solvents, such as methyl-ethyl-ketone and methyl-isobutyl-keton; aromatic hydrocarbons, such as benzene, toluene, and xylene; and chlorinated hydrocarbons, such as trichloroethylene and tetrachloroethylene.

The compositions of the present invention may also comprise, a diluent, such as a halogen-substituted hydrocarbon, an alcohol, an ester, or an ether that is inert to the organopolysiloxane having at least one radical of Formula I or II. Moreover, the compositions may comprise any of the thermal polymerization inhibitors mentioned above and fillers usually added to known photopolymerizable compositions, for example, silica powders. Any appropriate amounts of these additives may be used, but, since the thermal polymerization inhibitors are intended to improve the stability during storage (for prevention of reaction in the dark) of the compositions and prevent thermal polymerization from taking place, when the solvent evaporates from the compositions after they have been coated over substrate, it is preferred to use the polymerization inhibitor in amounts of about 0.05% by weight based on the weight of the organopolysiloxane having the radical of Formula I or II.

The coating of the photopolymerizable compositions over substrata may be carried out in accordance with a known method, for example, by flow, dip, whirler, spinner, spray or roller coating. No limitation is provided with respect to thickness of the coat; it is from 5 to 15$\mu$ in general.

As positive pattern 3 for the preparation of ion-etched printing plates according to the present invention, silver emulsion positive or negative transparency may be used. Further, the light source to which the photopolymerizable composition is exposed is a lamp giving off rays rich in ultraviolet rays, such as a carbon arc lamp, a xenon lamp, or a low-pressure, medium-pressure or high pressure mercury lamp, the rays being applied in either diffused or paralleled form.

Suitable exposure is determined according to distance between light source and printing frame, illuminance and time of exposure. For example, when a 3000 w. xenon lamp is used, the irradiation distance is 50 cm. and the time of exposure is 2 to 10 minutes. After exposure, the film on the plate is subjected to development according to a known method, for example, by dip, spray, or vapor.

Developers that may be used are exemplified by solvents of aromatic hydrocarbons, such as toluene and xylene, ketones, such as methylethyl ketones and methylisobutyl ketones, and chlorinated hydrocarbons, such as trichloroethylenes and tetrachloroethylenes. Fixing treatment after the completion of development may be carried out by various known methods. If heat treatment is allowed, it is carried out by, for example, post-baking at a temperature between 150 and 200° C. for about 10 minutes.

The exact mechanism by which photopolymerizable, hardened resists are formed on a surface not to be ion-etched is not known, but presumably, when the photopolymerizable compositions are coated over the surface, then dried and exposed to rays, the photopolymerizable organic radicals of Formula III in the organopolysiloxane having the radical of General Formula I or II that are exposed to the rays become excited by the rays, and by any photosensitizer and additive contained in the photopolymerizable compositions, and thus become polymerized, thereby forming hard and insoluble films, whereas the photopolymerizable organic radicals of formula III contained in the organopolysiloxane that are not exposed to the rays, photosensitizer and other additives contained in the photopolymerizable compositions remain unchanged by the rays and are therefore easily washed away with the solvent.

Ion-etching of the base plate 1 provided thereon with photopolymerizable, hardened patterned resists 2′ in the process of the present invention is carried out by a known manner. For example, a sample is placed at the center between two cathodes in a container, and glow discharge is caused therein by the same manner as in the sputter. In the glow discharge, a high purity argon or xenon gas is preferably used, with a pressure of from about 0.01 to 0.06 mm. Hg. Either direct current discharge or high-frequency discharge may be employed. In a conventional method in which a base plate provided with resists of a known photosensitive resin is used, the thickness of the resist film becomes reduced as ion-etching proceeds and it is feared that the resist films might be distinguished at the time of completion of the etching treatment. On the other hand, the photopolymerizable, hardened resist films obtained according to the present invention has a small sputter etch removal rate and, therefore, even though some reduction of the films in thickness is observed at the initial stage of etching, degree of such reduction is lowered thereafter and the films are not removed away before predetermined sizes and depths of etching have been attained. This excellent resisting property of the resist films of the present invention is considered to be due to the ≡Si—O— bonds in the polymerizable organic silicon radical contained in the photopolymerizable composition.

The method of the present invention can be employed with advantage for various purposes, including preparation of resistors of IC or LSI, since the photopolymerizable, hardened resists are provided with an excellent resisting property as described above, and therefore very useful for producing ion-etched products of fine patterns, with little side-etching phenomenon.

The following examples are given for purposes of illustration to aid in understanding the invention. In the examples parts are all by weight.

EXAMPLE 1

278 parts of γ-acryloxypropyltrichlorosilane were added dropwise to a mixture of 500 parts of water, 100 parts of toluene and 50 parts of isopropyl alcohol kept at 5–10° C. for one hour with stirring. After a hydrochloric acid containing layer and a siloxane-toluene layer have been separated, the siloxane-toluene layer was washed with water until its pH became 6.8. To this siloxane toluene layer were added 612 parts of dihylroxydimethylsilicone represented by the general formula $$HO-\left(-\underset{CH_3}{\overset{CH_3}{\underset{|}{\overset{|}{Si}}}}-O-\right)_n-H$$

where $n$ is 10,000, 0.5 part of potassium acetate, and 0.5 part of hydroquinone. The resulting mixture was subjected to reaction 110–115° C. for 8 hours, and from the reaction product the toluene was removed by distillation under reduced pressure, to obtain 754 parts of a pale yellow, transparent, solid photopolymerizable organopolysiloxane, having a pour point of 45° C., in a 97% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over an aluminum film of about 1,000 angstroms thick provided on a base plate of glass by the vaccum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 2

2,500 parts of water, 500 parts of toluene and 50 parts of isopropyl alcohol were put into a four-necked flask. The mixture was cooled and, while being kept at 5–10° C., added dropwise with a mixture of 74.8 parts of monomethyltrichlorosilane, 64.5 parts of dimethyldichlorosilane, 126.5 parts of diphenyldichlorosilane, 105.7 parts of monophenyltrichlorosilane, and 131 parts of γ-methacryloxypropyltrichlorosilane, for one hour with stirring. Thereafter, the resulting mixture was further stirred for 30 minutes, and washed with water until its pH became 7.0. Subsequently, it was distilled under reduced pressure so that the siloxane concentration became 50%. (The siloxane thus prepared contained 3.0% hydroxyl radical in volume.) To the siloxane were added 797 parts of diethyoxy-γ-trifluoropropylmethylpolysiloxane, having an average molecular weight of 1,594, represented by the general formula $$H_5C_2O-\left(\underset{CH_3}{\overset{CH_3}{\underset{|}{\overset{|}{Si}}}}-O\right)_{10}\left(\underset{CH_2CH_2CF_3}{\overset{CH_3}{\underset{|}{\overset{|}{Si}}}}-O\right)_5-C_2H_5$$

1.0 part of paratoluenesulfonic acid, and 0.3 part of methoxyhydroquinone as polymerization inhibitor. The resulting mixture was then stirred at 110° C. for 8 hours, during which the ethanol was removed from the flask by means of a distilling column attached thereto. Thereafter, with addition of 10 parts of sodium carbonate, neutralization reaction was carried out at 80° C. for 2 hours. The resulting product was cooled and then removed the sodium paratoluene sulfonate generated and surplus sodium carbonate by filtration and also the toluene by distillation under reduced pressure, to finally obtain 1,174 parts of a pale yellow, transparent, solid photopolymerizable organopolysiloxane, having pour point of 43° C., in a 96% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere or argon gas of $5\times10^{-3}$ mm. Hg and subjected to ion-etching by argon ions of 250 w., to obtain a base plate having etched patterns of silver.

When a vacuum-evaporated film of aluminum, nickel or copper was used in place of the above-mentioned silver film, a similar result was obtained.

EXAMPLE 3

To 92 parts of the (65%) toluene solution of siloxane produced during the procedures of Example 1 were added 276 parts of diacetoxymethylphenylsiloxane represented by the general formula $$CH_3COO-\left(\underset{CH_3}{\overset{CH_3}{\underset{|}{\overset{|}{Si}}}}-O\right)_m\left(\underset{C_6H_5}{\overset{C_6H_5}{\underset{|}{\overset{|}{Si}}}}-O\right)_n-OC-CH_3$$

where $m+n=5{,}000$ and $n/m+n=0.05$, 0.5 part of potassium acetate and 0.5 part of hydroquinone. The resulting mixture was reacted as in Example 1 for 10 hours, while removing acetic acid generated, to obtain 361 parts of a colorless, transparent, solid photopolymerizable organopolysiloxane, having a pour point of 53° C., in a 98% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirled coating into a layer of about 5μ thick (as dried) over a nickel film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of nickel.

When a vacuum-evaporated film of aluminum, silver or copper was used in place of the above-mentioned nickel film, a similar result was obtained.

EXAMPLE 4

To 329 parts of the (50%) toluene solution of siloxane produced during the procedures of Example 2 were added 845 parts of dichloro-γ-trifluoropropylmethylpolysiloxane having an average molecular weight of 1,689, represented by the general formula

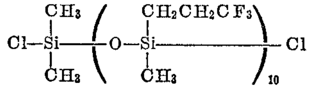

80 parts of pyridine, 329 parts of tetrahydrofuran. The mixture was then stirred at 80–85° C. for 4 hours. Thereafter, the recation product was washed with water to remove the pyridine hydrochloride and tetrahydrofuran, and then, subjected to distillation under reduced pressure to remove the toluene, to yield 1,069 parts of a pale yellow, transparent, photopolymerizable organopolysiloxane, having a pour point of 35° C., in a 94% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over a copper film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of copper.

When a vacuum-evaporated film of aluminum, silver or nickel was used in place of the above-mentioned copper film, a similar result was obtained.

EXAMPLE 5

239 parts of disodium methylphenyl siliconate having an average molecular weight of 2,386, represented by the general formula

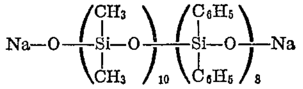

and 239 parts of toluene were put into a four-necked flask. While being stirred at room temperature, the mixture was added dropwise with 28 parts of γ-methacryloxypropyltrichlorosilane for one hour, and thereafter stirring was continued for another 8 hours in order to complete reaction. The resulting product was washed with water until its pH became 7.0, and then the toluene was removed by distillation under reduced pressure, to yield 251 parts of a photopolymerizable organopolysiloxane having a pour point of 80° C., in a 96% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 6

149 parts of monomethyltrichlorosilane, 280 parts of γ-methacryloxypropyltrichlorosilane, and 258 parts of diphenyldichlorosilane were put into a four-necked flask. The mixture was added with 224 parts of methanol dropwise for one hour with stirring. Thereafter, the mixture was heated up to 98° C., while hydrochloric acid being generated, and then the temperature was lowered down to 50° C. or under, when 1.5 parts of ferric chloride was added. The resulting mixture was then gradually heated, while methyl chloride being generated, so that reaction take place at 120° C. for 5 hours. Only after the generation of methyl chloride was ceased, 729 parts of toluene were added. The product was washed with water until its pH became 7.0 and then subjected to distillation under reduced pressure thereby to remove the toluene, and to finally obtain 755 parts of a solid photopolymerizable organopolysiloxane, having a pour point of 95° C., in a 95% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 7

500 parts of water, 74 parts of toluene, and 99 parts of n-butyl alcohol were put into a four-necked flask and cooled down to 10° C. or under. To the mixture was added dropwise a mixture of 74 parts of dimethyldichlorosilane, 101 parts of diphenyldichlorosilane, 21 parts of monophenyltrichlorosilane, and 29 parts of γ-methacryloxypropyltriethoxysilane for one hour. Thereafter, the resulting mixture was stirred for 30 minutes and then was allowed to stand till the layer of hydrochloric acid was separated. The solvent layer was washed with water until its pH became 7–8. After the washing, the layer was distilled under reduced pressure to remove toluene, butyl alcohol and water involved, to obtain 160 parts of a pale yellow, transparent, solid photopolymerizable organopolysiloxane, having a pour point of 73° C., in 93% yield.

A photosensitizer and a solvent were added to this organopolysiloxane to give the following composition:

| | Parts |
|---|---|
| Photopolymerizable organopolysiloxane prepared in the manner described above | 100 |
| 4,4′-bis(dimethylamino)benzophene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w. to obtain a base plate having etched patterns of aluminum.

When a vacuum-evaporated film of silver, nickel or copper was used in place of the above-mentioned aluminum film, a similar result was obtained.

EXAMPLE 8

115 parts of methylhydrogen dichlorosilane, 149 parts of monomethyltrichlorosilane, 211 parts of monophenyltrichlorosilane and 516 parts of dimethyldichlorosilane were added dropwise for two hours to a mixture of 1,000 parts of toluene, 100 parts of methanol and 5,000 parts of water, which mixture was kept stirring at 5–10° C. The resulting mixture was washed with water until its pH became 7.0, and then from the system was removed toluene by distillation under reduced pressure till 50% of the siloxane concentration was gained. Subsequently, a mixture of 138 parts of allyl methacrylate, 0.2 part of a 2% isopropanol solution of chloroplatinic acid and 0.5 part of hydroquinone was slowly added dropwise to the system, while paying attention to the generation of heat. When the addition was over, the mixture was heated to 80° C., at which reaction took place for 10 hours. When the reaction was completed, unreacted substances and toluene were removed by distillation under reduced pressure, yielding 628 parts of a solid photopolymerizable organopolysiloxane, having a pour point of 48° C., in a 95% yield.

A photosensitizer and a solvent were added to this organopolysiloxane to give the following composition:

| | Parts |
|---|---|
| Photopolymerizable organopolysiloxane prepared in the mannuer described above | 100 |
| 5-nitroacenaphthene | 4 |
| Toluene | 1,000 |

This composition was applied by whirler coating into a layer of about 5μ thick (as dried) over an aluminum film of about 1,00 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 9

A mixture of 198 parts of γ-chloropropyl trimethyoxysilane and 91 parts of γ-chloropropyl methyldichlorosilane was added dropwise for one hour to a mixture of 200 parts of toluene, 500 parts of water and 50 parts of isopropyl alcohol kept at 5–10° C. with stirring. Thereafter, the resulting mixture solution was washed with water until its pH became 7.0. The siloxane layer obtained was added at room temperature with 257 parts of sodium cinnamate, and the mixture was subjected to reaction at 80° C. for 5 hours. When the sodium chloride and unreacted substances were removed by filtration, and the toluene by distillation under reduced pressure, 320 parts of a pale yellow, transparent, solid photopolymerizable organopolysiloxane having a pour point of 95° C. were produced.

A photosensitizer and a solvent were added to this organopolysiloxane to give the following composition:

| | Parts |
|---|---|
| Photopolymerizable organplysilxane prepared in the manner described above | 100 |
| 4,4′-bis(dimethylamino)benzophene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 10

415 parts of the same toluene solution of siloxane as used in Example 8 were added dropwise for one hour to a mixture of 285 parts of allyl glycidyl ether, 0.5 part of a 2% butanol solution of chloroplatinic acid, and 0.5 part of hydroquinone kept at 80° C. The resulting mixture was reacted for 8 hours. After the reaction was over, the reaction system was cooled down to 50° C., and then added with 375 parts of cinnamic acid and 2.5 parts of tin tetrachloride, and were kept at that temperature for 10 hours. When the reaction came to an end, the unreacted substances and toluene were removed by distillation under reduced pressure and by filtration, to obtain 999 parts of photopolymerizable organopolysiloxane, having a pour point of 60° C., in a 93% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subpected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 11

149 parts of monomethyltrichlorosilane, 253 parts of diphenyldichlorosilane, 129 parts of dimethyldichlorosilane and 106 parts of monophenyltrichlorosilane were put into a four-necked flask equipped with an HCl absorbing apparatus. The content, while being stirred, was added with 63 parts of water dropwise for one hour, at 10° C. or under. Then the temperature was gradually raised and the generated HCl was removed from the system. The mixture was stirred at 110° C. for 3 hours. When no more generation of HCl was witnessed, the temperature was lowered to 50° C., and then 255 parts of sodium cinnamate were added and stirred for 5 hours. After the reaction was over, the sodium chloride formed was removed by filtration and the toluene and the unreacted substances by distillation under reduced pressure, to obtain 594 parts of a photopolymerizable organopolysiloxane, solid, pale yellow and transparent, having a pour point of 95° C., in a 95% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 12

740 parts of octamethylcyclodimethylsiloxane, 0.89 part of dimethyldicinnamoyloxysilane, and 37 parts of acid clay were put into a three-necked flask. The mixture was heated with stirring and kept at 110° C. for 24 hours. After the mixture was cooled, and then diluted with 740 parts of toluene, the acid clay and the unreacted substances were removed by filtration and the toluene by distillation under reduced pressure, to produce 710 parts of a rubbery photopolymerizable organopolysiloxane in a 96% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of silver.

When a vacuum-evaporated film of aluminum, nickel or copper was used in place of the above-mentioned silver film, a similar result was obtained.

EXAMPLE 13

740 parts of dimethoxydimethylpolysiloxane represented by the general formula $$CH_3-O-\left(\begin{array}{c}CH_3\\ |\\ -Si-O-\\ |\\ CH_3\end{array}\right)_n-CH_3$$

where $n$ is 5,000, 1,110 parts of toluene, 50 parts of cinnamic acid, 0.1 part of potassium acetate, and 0.05 part of hydroquinone were put into a flask equipped with a distilling column. The mixture was heated with stirring and kept at temperatures of from 110 to 120° C., and subjected to reaction for 24 hours, during which the methanol formed was removed by fractional distillation by means of the distilling column. Thereafter, the toluene and the unreacted substances were removed by distillation under reduced pressure, to obtain 703 parts of a rubbery photopolymerizable organopolysiloxane in a 95% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over a nickel film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of nickel.

When a vacuum-evaporated film of aluminum, silver or copper was used in place of the above-mentioned nickel film, a similar result was obtained.

EXAMPLE 14

To a mixture of 200 parts of monophenyltrichlorosilane, 50 parts of dimethyldichlorosilane, 100 parts of diphenyldichlorosilane, 350 parts of toluene, and 50 parts of methylethyl ketone, kept at 5–10° C., were added dropwise 35 parts of water. After the generated HCl, the unreacted silane, the toluene and the methylethyl ketone were removed by distillation under reduced pressure, the residue was cooled to 50° C., and then added and mixed with 159 parts of toluene, 30 parts of triethylamine, and 30 parts of sodium cinnamate, and subjected to reaction for 4 hours. Following the reaction, the triethylamine and the generated sodium chloride and the unreacted sodium cinnamate were removed by filtration, and the toluene by distillation under reduced pressure, to obtain 160 parts of a solid photopolymerizable organopolysiloxane having a pour point of 68° C.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over a copper film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of copper.

When a vacuum-evaporated film of aluminum, nickel or silver was used in place of the above-mentioned copper film, a similar result was obtained.

EXAMPLE 15

150 parts of silane of Example 14 and 150 parts of toluene were mixed. The mixture was kept at 50° C., added with 50 parts of sodium cinnamate and subsequently stirred for 8 hours for reaction. After the reaction was over, the resulting product was cooled, and the unreacted sodium cinnamate was removed by filtration and the toluene by distillation under reduced pressure, to yield 168 parts of a photopolymerizable organopolysiloxane having a pour point of 70° C.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 16

A mixture of 376 parts of α,ω-dichlorodimethylpolysiloxane represented by the general formula $$Cl-\left(\begin{matrix}CH_3\\|\\Si-O\\|\\CH_3\end{matrix}\right)_{40}\begin{matrix}CH_3\\|\\Si-Cl\\|\\CH_3\end{matrix}$$

212 parts of phenyltrichlorosilane and 250 parts of toluene was added dropwise to another mixture of 250 parts of toluene, 118 parts of isopropylalcohol, and 1180 parts of water, kept at 5–10° C. After the addition was over, the mixture was stirred at 20° C. for 30 minutes. The siloxane layer formed was washed three times with a 2% aqueous solution of sodium sulfate, and after the remaining water was removed as toluene azeotrope, 50 part of γ-methacryloxypropyltrimethoxysilane, 0.2 part of 2,6-ditertiary butylhydroxytoluene as a polymerization inhibitor, and 0.2 part of zinc octoate were added to the siloxane to be reacted for 8 hours in the refluxing toluene. Thereafter, the toluene was removed by distillation under reduced pressure, to obtain 519 parts of a photopolymerizable organopolysiloxane having a pour point of 85° C., in a 97% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to dry at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce photopolymerized, hardened resists. The base plate having the resists on its surface was then placed in an atmosphere of argon gas of $5\times10^{-3}$ mm. Hg and subjected to ion-etching by argon ions of 250 w., to obtain a base plate having etched patterns of silver.

When a vacuum-evaporated film of aluminum, nickel or copper was used in place of the above-mentioned silver film, a similar result was obtained.

EXAMPLE 17

To 907 parts of a 55% toluene solution of the siloxane hydrolyzed during the procedure of Example 16 were added 63 parts of δ-cinnamoyloxybutylmethyldimethoxysilane, 0.2 part of methoxyhydroquinone, and 0.2 part of dibutyltindilaurate. The mixture was reacted for 8 hours in a reflux of toluene. The methanol generated was removed together with toluene, and any toluene still remaining was removed by distillation under reduced pressure, to obtain 530 parts of a photopolymerizable organopolysiloxane, solid at room temperature, in a 96% yield.

A photosensitizer and a solvent were added to this organopolysiloxane to give the following composition:

| | Parts |
|---|---|
| Photopolymerizable organopolysiloxane prepared in the manner described above | 100 |
| 5-nitroacenaphthene | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produe photopolymerized, hardened resists. The base plate having the resists on its surface was then placed in an atmosphere of argon gas of $5\times10^{-3}$ mm Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 18

A mixture of 384 parts of α,ω-dichlorodimethylpolysiloxane represented by the general formula $$Cl-\left(\begin{matrix}CH_3\\ |\\ Si-O\\ |\\ CH_3\end{matrix}\right)_{10}-\begin{matrix}CH_3\\ |\\ Si\\ |\\ CH_3\end{matrix}-Cl$$

212 parts of phenyltrichlorosilane and 250 parts of toluene was added dropwise for one hour to another mixture of 250 parts of toluene, 125 parts of isopropylalcohol, and 1,250 parts of water, kept at 20–35° C., to be hydrolyzed.

After the resulting product was stirred at 35° C. for one hour, the siloxane layer formed was washed with water so that its pH gained a value of 6.9, and its water content was removed as azeotrope. Then, 97 parts of cinnamoyloxymethyltriethoxysilane, 0.1 part of methoxyhydroquinone, and 0.2 part of dibutyltin-dioctoate were added to the washed siloxane for reaction for 14 hours, while the generated ethanol was removed. When the toluene was removed by distillation under reduced pressure, 547 parts of a photopolymerizable organopolysiloxane, having a little fluidity, was obtained in a 97% yield.

A photosensitizer and a solvent were added to this organopolysiloxane to give the following composition:

| | Parts |
|---|---|
| Photopolymerizable organopolysiloxane prepared in the manner described above | 100 |
| 4,4′-bis(dimethylamino)benzophenone | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 250 w., to obtain a base plate having etched patterns of silver.

When a vacuum-evaporated film of aluminum, nickel or copper was used in place of the above-mentioned silver film, a similar result was obtained.

EXAMPLE 19

569 parts of dichlorodimethylpolysiloxane represented by the general formula $$Cl-\left(\begin{matrix}CH_3\\ |\\ SiO\\ |\\ CH_3\end{matrix}\right)_{20}-\begin{matrix}CH_3\\ |\\ Si\\ |\\ CH_3\end{matrix}-Cl$$

370 parts of phenyltrichlorosilane, and 128 parts of γ-bromopropyltrichlorosilane were dissolved in 434 parts of toluene. The resulting solution was added dropwise with stirring for 2 hours to a mixture of 434 parts of toluene, 213 parts of isopropyl alcohol, and 2130 parts of water, kept at 10–20° C. Even after the addition was over, the mixture was stirred at 20° C. for 30 minutes. Then, the siloxane layer formed was washed with water to have a pH value of 7, and the water content was removed as the toluene azeotrope. To the siloxane were added 0.2 part of 2,6 - ditertiary - butylhydroxytoluene, 30 parts of triethylamine, and 128 parts of sodium cinnamate, and the resulting mixture was subjected to reaction at 110–115° C. for 8 hours. When toluene was removed by distillation under reduced pressure from the solution, which had been separated by filtration from the reaction product, there was obtained 846 parts of a photopolymerizable organopolysiloxane, having a pour point of 65° C., in a 94% yield.

A photosensitizer and a solvent were added to this organopolysiloxane to give the following composition:

| | Parts |
|---|---|
| Photopolymerizable organopolysiloxane prepared in the manner described above | 100 |
| 4,4′-bis(dimethylamino)benzophenone | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 20

To 1,446 parts of a 60% toluene solution of the siloxane hydrolyzed during the procedures of Example 19, were added 0.2 part of hydroquinone, 3 parts of triethylamine hydrochloride, and 93 parts of potassium methacrylate. The mixture was reacted at 120° C. for 8 hours. When the potassium chloride formed and the unreacted potassium methacrylate were removed by filtration and the toluene by distillation under reduced pressure, there were obtained 827 parts of a photopolymerizable organopolysiloxane having a pour point of 55° C., in a yield of 95%.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over a copper film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of copper.

When a vacuum-evaporated film of aluminum, nickel or silver was used in place of the above-mentioned copper film, a similar result was obtained.

EXAMPLE 21

A mixture of 486 parts of trichlorophenyl methylpolysiloxane represented by the general formula $$C_6H_5-Si\left[\left(O-\underset{CH_3}{\overset{CH_3}{\underset{|}{\overset{|}{Si}}}}\right)_{10}-Cl\right]_3$$

254 parts of phenyltrichlorosilane and 313 parts of toluene was added dropwise with stirring to a mixture of 313 parts of toluene, 148 parts of isopropyl-alcohol and 1,480 parts of water in a four-necked flask, kept at room temperature. After the addition was over, the mixture was further stirred at 30° C. for 30 minutes. From the reaction product the formed water layer was removed, and the remaining reaction product was washed with a 2% aqueous solution of sodium sulfate three times. Water still contained in the residue was separated as the toluene azeotrope. Hydroxyl radicals contained in the siloxane thus prepared proved to be 2.4% by weight. To the toluene solution of siloxane were added 152 parts of triethylamine and to the mixture were added dropwise 75 parts of methyltrichlorosilane, dissolved in 130 parts of toluene, and were stirred for one hour. To the mixture thus prepared were added 130 parts of methacryloxyethyl alcohol to be reacted at 50° C. for 2 hours. After the reaction was over, from the reaction product were removed the generated triethylamine hydrochloride by filtration and the toluene by distillation under reduced pressure, to obtain 665 parts of a photopolymerizable organopolysiloxane, soft and rubbery, in a yield of 91%.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried over nickel film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of nickel.

When a vacuum-evaporated film of aluminum, silver or copper was used in place of the above-mentioned nickel film, a similar result was obtained.

EXAMPLE 22

To 620 parts of a 50% toluene solution of the hydrolyzed siloxane of Example 21, having 2.4% by weight of hydroxyl radical were added 35 parts of pyridine. The mixture was added dropwise with 75 parts of methyltrichlorosilane, dissolved in 100 parts of toluene, kept at 50° C. for one hour. To the reaction product were added 200 parts of sodium cinnamate. Then the generated amine hydrochloride and sodium chloride and the unreacted sodium cinnamate were removed by filtration and the toluene by distillation under reduced pressure, to obtain 454 parts of a solid photopolymerizable organopolysiloxane in a 92% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 250 w., to obtain a base plate having etched patterns of silver.

When a vacuum-evaporated film of aluminum, nickel or copper was used in place of the above-mentioned silver film, a similar result was obtained.

EXAMPLE 23

A mixture of 751 parts of α,ω-dichlorodimethylpolysiloxane represented by the general formula $$Cl-\left(\underset{CH_3}{\overset{CH_3}{\underset{|}{\overset{|}{Si}}}}-O\right)_{49}-\underset{CH_3}{\overset{CH_3}{\underset{|}{\overset{|}{Si}}}}-Cl$$

425 parts of phenyltrichlorosilane, and 1,000 parts of methyl ethyl ketone was put into a four-necked flask equipped with a gas-cooling tube, a thermometer and a dropping funnel, and was cooled to 5° C. The mixture was added dropwise with a mixture of 25 parts of water and 52 parts of acetone, and was stirred at 50° C. for one hour, while the hydrochloric acid generated was removed from the system, which then was cooled to 10° C. and was mixed with 120 parts of sodium cinnamate. From the resulting product, the generated sodium chloride was removed by filtration and the methyl ethyl ketone by distillation, to obtain 1.020 parts of a solid photopolymerizable organopolysiloxane in a 94% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over an aluminum film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 300 w., to obtain a base plate having etched patterns of aluminum.

When a vacuum-evaporated film of silver, nickel or copper was used in place of the above-mentioned aluminum film, a similar result was obtained.

EXAMPLE 24

1,000 parts of a 50% methyl ethyl ketone solution of partially hydrolyzed siloxane, synthesized during the proceeding of Example 23 were cooled to 10° C., and were added dropwise with 85 parts of glycidylmethacrylate with stirring. After the reaction was over, 10 parts of ethylene oxide were blown through the reaction product. When the methyl ethyl ketone and any surplus ethylene oxide were removed by distillation under reduced pressure, there was obtained 567 parts of a photopolymerizable organopolysiloxane, soft and rubbery, in a 97% yield.

A photosensitizer and a solvent were added to this organopolysiloxane to give the following composition:

| | Parts |
|---|---|
| Photopolymerizable organopolysiloxane prepared in the manner described above | 100 |
| 4,4'-bis(dimethylamino)benzophenone | 4 |
| Toluene | 1,000 |

This composition was applied by whirler coating into a layer of about 5μ thick (as dried) over a silver film of about 1,000 angstroms thick provided on a base plate of glass by the vacuum evaporation coating method, and then subjected to drying at 80° C. for 10 minutes. Thereafter, a positive pattern was mounted on the coat layer in close contact and exposed, under reduced pressure, to rays from a 3,000 w. xenon lamp for 3 to 4 minutes. The layer was then developed by use of a developer comprising 100 parts of toluene and 150 parts of cyclohexane, dried and treated at 210° C. in an oven for 20 minutes, to produce a photopolymerized, hardened resists. The base plate having the resists on its surface was then placed in an atmosphere of argon gas of $5\times10^{-3}$ mm. Hg and subjected to ion-etching by argon ions of 250 w., to obtain a base plate having etched patterns of silver.

When a vacuum-evaporated film of aluminum, nickel or copper was used in place of the above-mentioned silver film, a similar result was obtained.

What is claimed is:

1. An ion-etching method comprising providing on a plate surface photopolymerizable, hardened resists made of a photopolymerizable composition comprising at least one photopolymerizable organopolysiloxane having in its molecule at least one photopolymerizable organic radical represented by the general formula $$H\overset{R^1}{\overset{|}{C}}=\overset{R^2}{\overset{|}{C}}-\underset{O}{\underset{\|}{C}}-O-$$

where $R^1$ is a hydrogen atom or an unsubstituted or halogen-substituted phenyl radical, $R^2$ is a hydrogen atom or a methyl radical, a photosensitizer and a solvent, subjecting the said photopolymerizable composition to an imagewise exposure of actinic radiation to harden the said composition in the exposed areas, developing the said plate to remove the unexposed areas to expose the surface of the said plate, subjecting the plate surface thus treated to ion-etching and removing the resists, to produce an ion-etched plate.

2. The method as claimed in claim 1 wherein said photopolymerizable polysiloxane has at least one polymerizable radical represented by the general formula $$H\overset{R^1}{\overset{|}{C}}=\overset{R^2}{\overset{|}{C}}-\underset{O}{\underset{\|}{C}}-O-R^3-\overset{R_a^4}{\overset{|}{Si}}X_bO_{\frac{3-a-b}{2}}$$

where $R^1$ is a hydrogen atom or an unsubstituted or halogen-substituted phenyl radical, $R^2$ is a hydrogen atom or a methyl radical, $R^3$ is an unsubstituted or halogen-substituted divalent hydrocarbon radical, having from 1 to 10 carbon atoms, $R^4$ is an unsubstituted or a halogen-substituted monovalent hydrocarbon radical, having from 1 to 10 carbon atoms, X is a hydroxyl radical or an alkoxy radical, having from 1 to 4 carbon atoms, $a$ and $b$ are 0, 1 or 2, with the proviso that $(a+b)=0$, 1 or 2.

3. The method as claimed in claim 1 wherein said photopolymerizable polysiloxane has at least one polymerizable radical represented by the general formula $$H\overset{R^1}{\overset{|}{C}}=\overset{R^2}{\overset{|}{C}}-\underset{O}{\underset{\|}{C}}-O-\left(R^3-O\right)_l-\overset{R_m^4}{\overset{|}{Si}}X_nO_{\frac{3-m-n}{2}}$$

where $R^1$ is a hydrogen atom or an unsubstituted or halogen-substituted phenyl radical, $R^2$ is a hydrogen atom or a methyl radical, $R^3$ is an unsubstituted or halogen-substituted divalent hydrocarbon radical, having from 1 to 10 carbon atoms, $R^4$ is an unsubstituted or halogen-substituted monovalent hydrocarbon radical, having from 1 to 10 carbon atoms, X is a hydroxyl radical or an alkoxy radical, having from 1 to 4 carbon atoms, $l$ is 0 or 1, and $m$ and $n$ are 0, 1 or 2, with the proviso that $(m+n)=0$, 1 or 2.

4. The method as claimed in claim 1 wherein said photopolymerizable composition comprises an organopolysiloxane having at least one photopolymerizable organic radical represented by the general formula

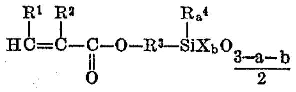

where $R^1$ is a hydrogen atom or an unsubstituted or halogen-substituted phenyl radical, $R^2$ is a hydrogen atom or a methyl radical, $R^3$ is an unsubstituted or halogen-substituted divalent hydrocarbon radical, having from 1 to 10 carbon atoms, $R^4$ is an unsubstituted or a halogen-substituted monovalent hydrocarbon radical, having from 1 to 10 carbon atoms, X is a hydroxyl radical or an alkoxy radical, having from 1 to 4 carbon atoms, $a$ and $b$ are 0, 1 or 2, with the proviso that $(a+b)=0$, 1 or 2, or by the general formula

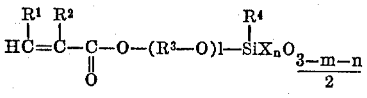

where $R^1$, $R^2$, $R^3$, $R^4$ and X are as defined above, $l$ is 0 or 1 and $m$ and $n$ are 0, 1 or 2, with the proviso that $(m+n)=0$, 1 or 2, a photosensitizer and a solvent.

References Cited

UNITED STATES PATENTS

| | | | |
|---|---|---|---|
| 3,272,670 | 9/1966 | Myers | 96—36 |
| 3,348,944 | 10/1967 | Michalchk | 96—35.1 |
| 2,904,481 | 9/1959 | Lawton et al. | 117—93.31 |
| 2,763,609 | 9/1956 | Lewis et al. | 117—93.31 |
| 2,766,220 | 10/1956 | Kantor | 117—93.31 |
| 3,632,399 | 1/1972 | Burlant et al. | 117—93.31 |
| 3,650,813 | 3/1972 | Nordstrom et al. | 117—93.31 |
| 3,669,796 | 6/1972 | Hall et al. | 117—93.31 |

NORMAN G. TORCHIN, Primary Examiner

E. C. KIMLIN, Assistant Examiner

U.S. Cl. X.R.

96—115 P, 35.1; 117—93.31; 156—13, 18